(12) United States Patent
Chopra

(10) Patent No.: US 7,214,614 B2
(45) Date of Patent: May 8, 2007

(54) SYSTEM FOR CONTROLLING METAL FORMATION PROCESSES USING ION IMPLANTATION

(75) Inventor: Dinesh Chopra, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 665 days.

(21) Appl. No.: 10/680,581

(22) Filed: Oct. 7, 2003

(65) Prior Publication Data

US 2004/0072424 A1 Apr. 15, 2004

Related U.S. Application Data

(62) Division of application No. 10/210,932, filed on Aug. 2, 2002, now Pat. No. 6,727,175.

(51) Int. Cl.
*H01L 21/44* (2006.01)

(52) U.S. Cl. .................. 438/659; 438/677; 438/678; 438/680; 438/687; 438/918; 438/946; 257/E21.473

(58) Field of Classification Search ............... 438/659, 438/677, 678, 680, 687, 918, 946; 257/E21.473
See application file for complete search history.

(56) References Cited

U.S. PATENT DOCUMENTS 5,907,789 A * 5/1999 Komatsu ............... 438/649
6,015,749 A * 1/2000 Liu et al. ............... 438/628
6,268,291 B1 7/2001 Andricacos et al. ........ 438/694

(Continued)

OTHER PUBLICATIONS

Shibata et al., "Lithography-less Ion Implantation Technology for Agile Fab," ULVAC Confidential.

(Continued)

*Primary Examiner*—Michael Lebentritt
*Assistant Examiner*—Stanetta Isaac
(74) *Attorney, Agent, or Firm*—Williams, Morgan & Amerson, P.C.

(57) ABSTRACT

The present invention is generally directed to various methods of using ion implantation techniques to control various metal formation processes. In one illustrative embodiment, the method comprises forming a metal seed layer above a patterned layer of insulating material, the patterned layer of insulating material defining a plurality of field areas, deactivating at least a portion of the metal seed layer in areas where the metal seed layer is positioned above at least some of the field areas, and performing a deposition process to deposit a metal layer above the metal seed layer. In some embodiments, the metal may be comprised of copper, platinum, nickel, tantalum, tungsten, cobalt, etc. Portions of the metal seed layer may be deactivated by implanting ions into portions of the metal seed layer positioned above at least some of the field areas. The implanted ions may be comprised of nitrogen, carbon, silicon, hydrogen, etc. In yet another illustrative embodiment, the system comprises a stencil mask implant tool for implanting ions into selected areas of a metal seed layer formed above a patterned layer of insulating material that defines a plurality of field areas, the ions being implanted into areas of the metal seed layer positioned above at least some of the field areas.

14 Claims, 5 Drawing Sheets

U.S. PATENT DOCUMENTS

| | | | |
|---|---|---|---|
| 6,297,155 B1 | 10/2001 | Simpson et al. | 438/687 |
| 6,518,184 B1 | 2/2003 | Chambers et al. | 438/687 |
| 6,534,865 B1 | 3/2003 | Lopatin et al. | 438/618 |
| 6,930,316 B2* | 8/2005 | Nishihashi et al. | 250/492.21 |
| 2002/0019131 A1 | 2/2002 | Ohtsuka et al. | 438/687 |
| 2002/0066872 A1* | 6/2002 | Nishihashi et al. | 250/492.21 |
| 2002/0076925 A1 | 6/2002 | Marieb et al. | 438/678 |
| 2002/0115292 A1 | 8/2002 | Andricacos et al. | 438/687 |

OTHER PUBLICATIONS

Shibata et al., "Stencil Mask Ion Implantation Technology for High Performance MOSFETs," 2000 IEEE.

* cited by examiner

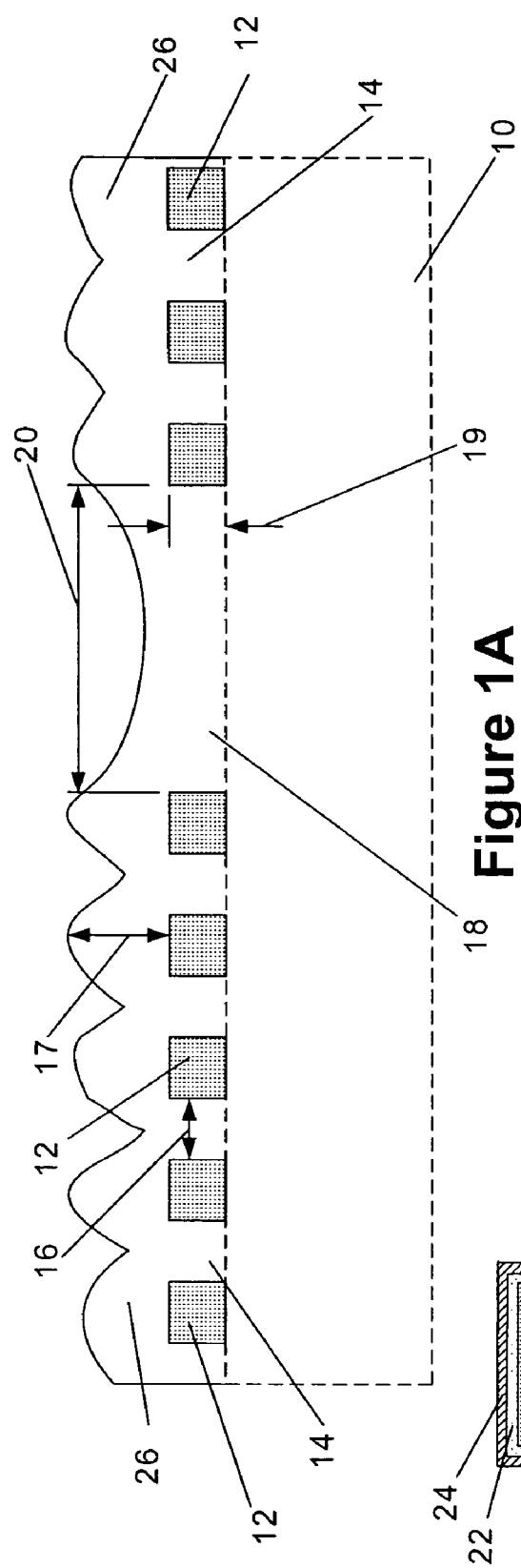
Figure 1A
Figure 1B
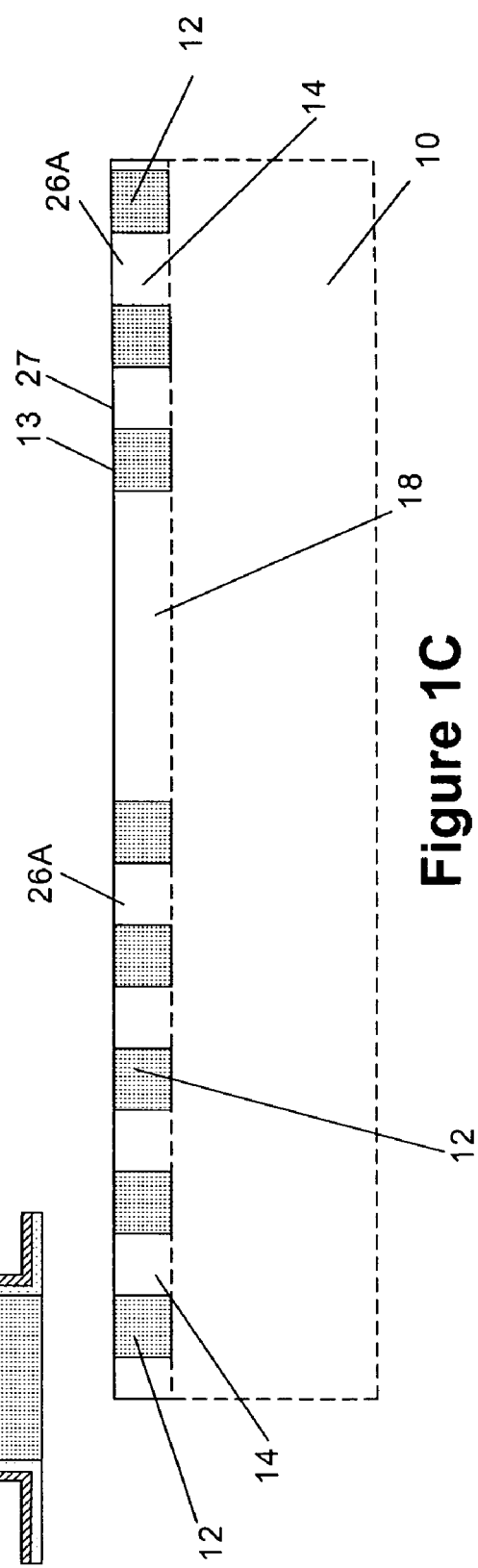
Figure 1C

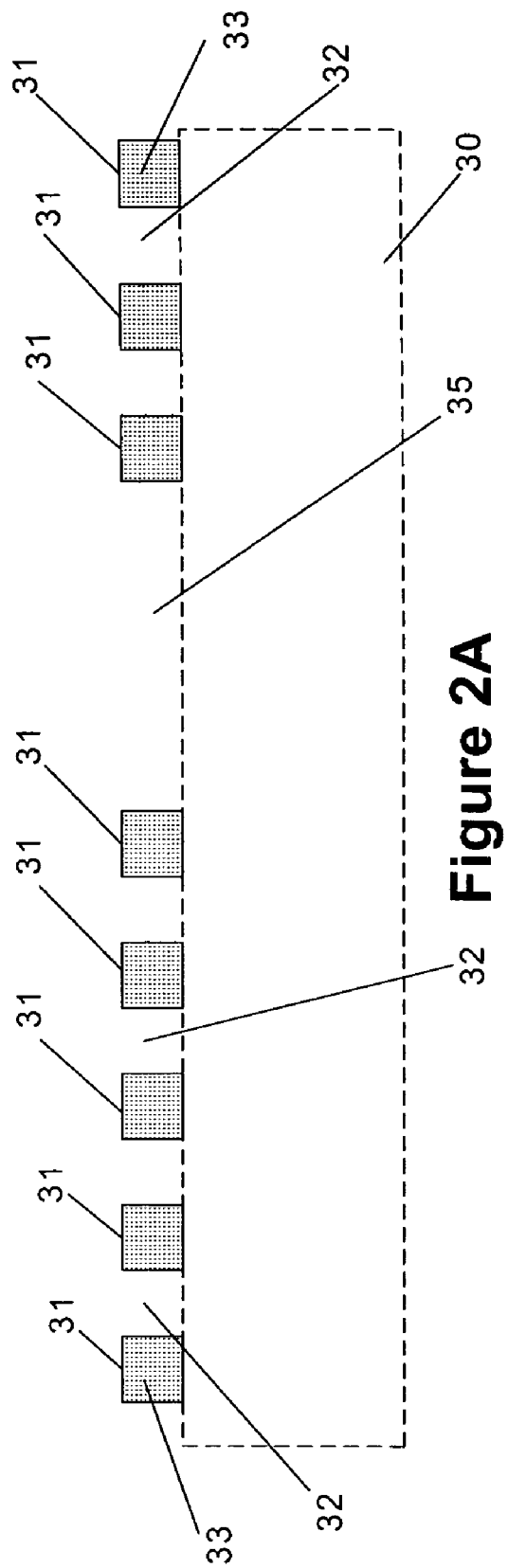
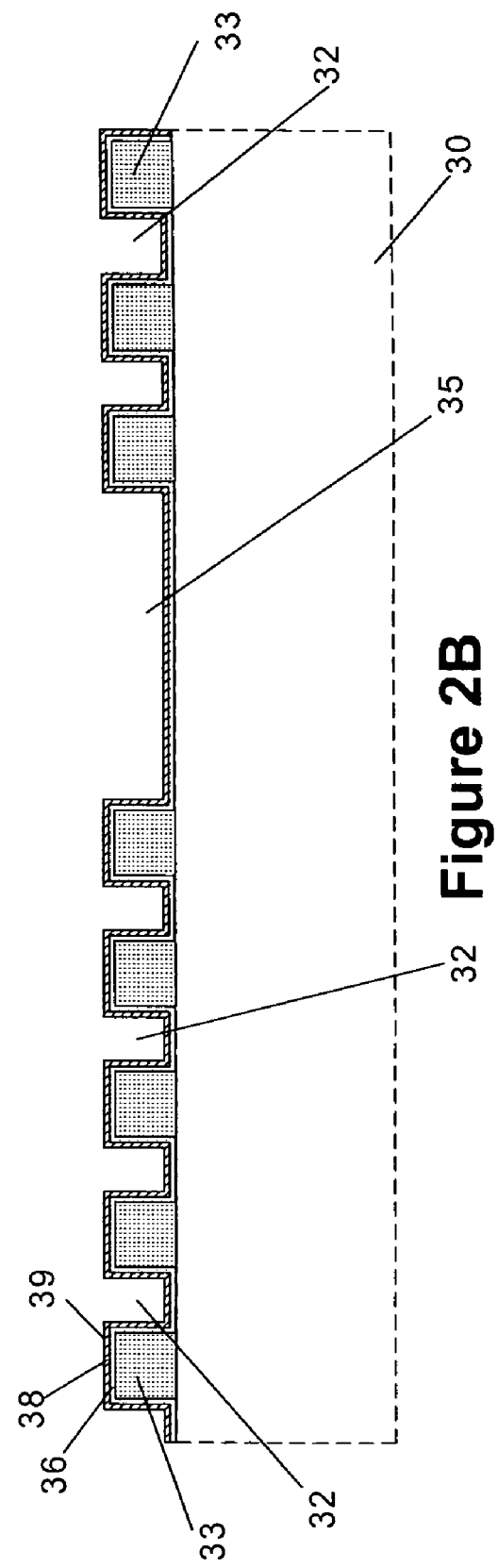

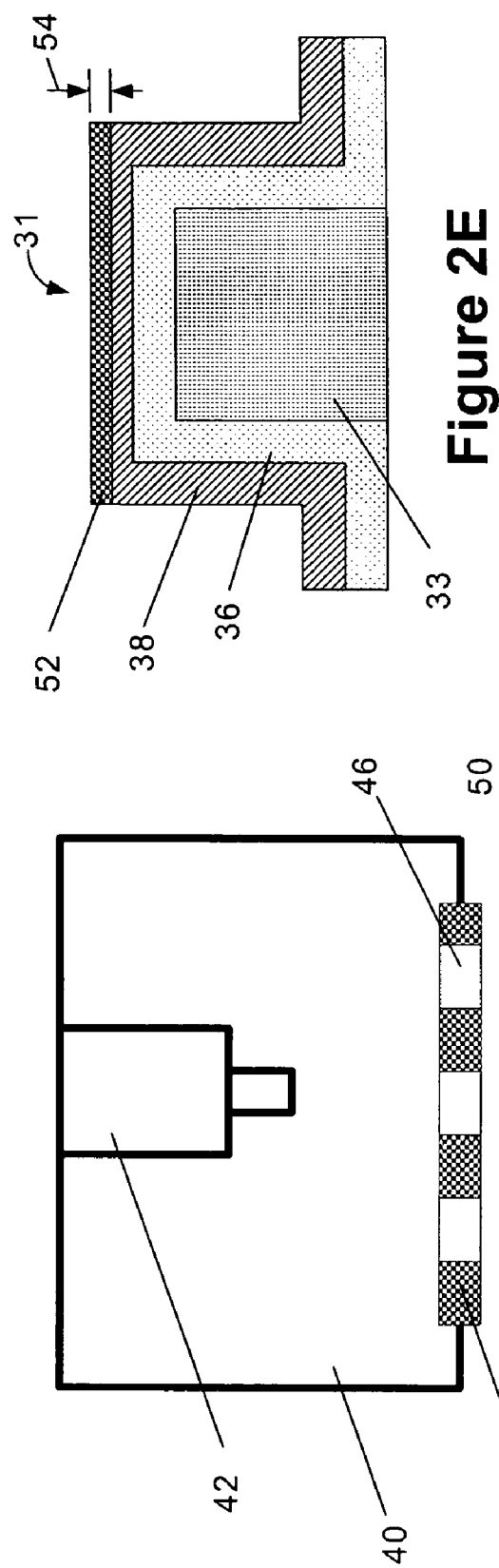
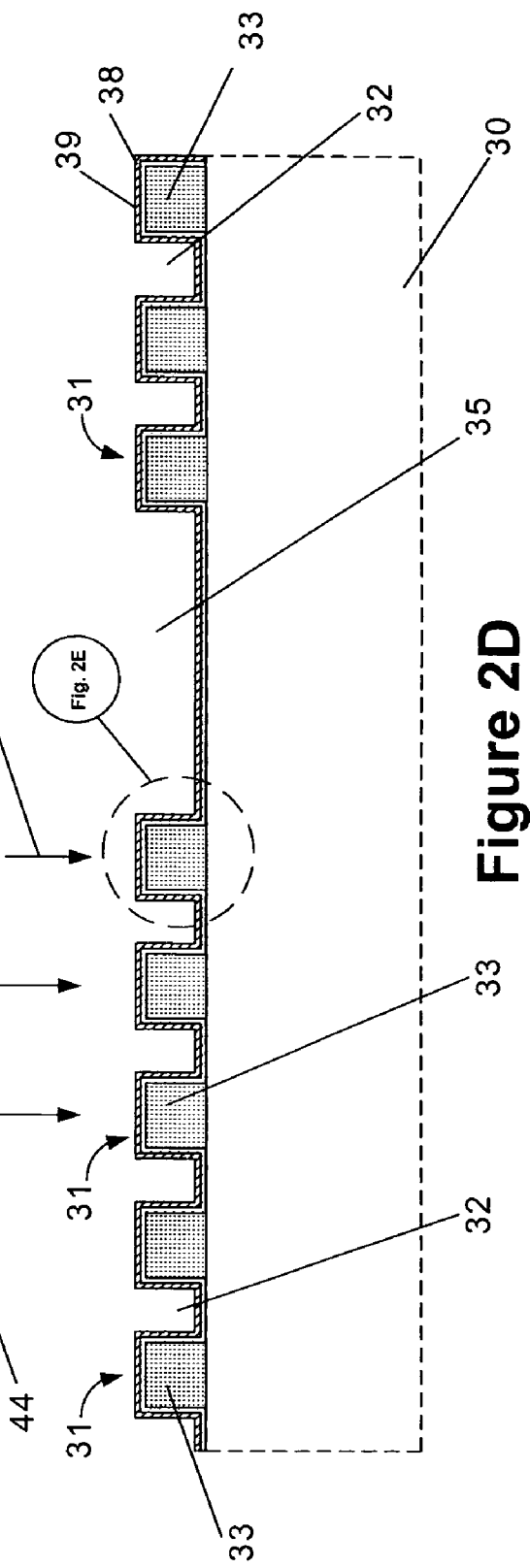
Figure 2E
Figure 2D

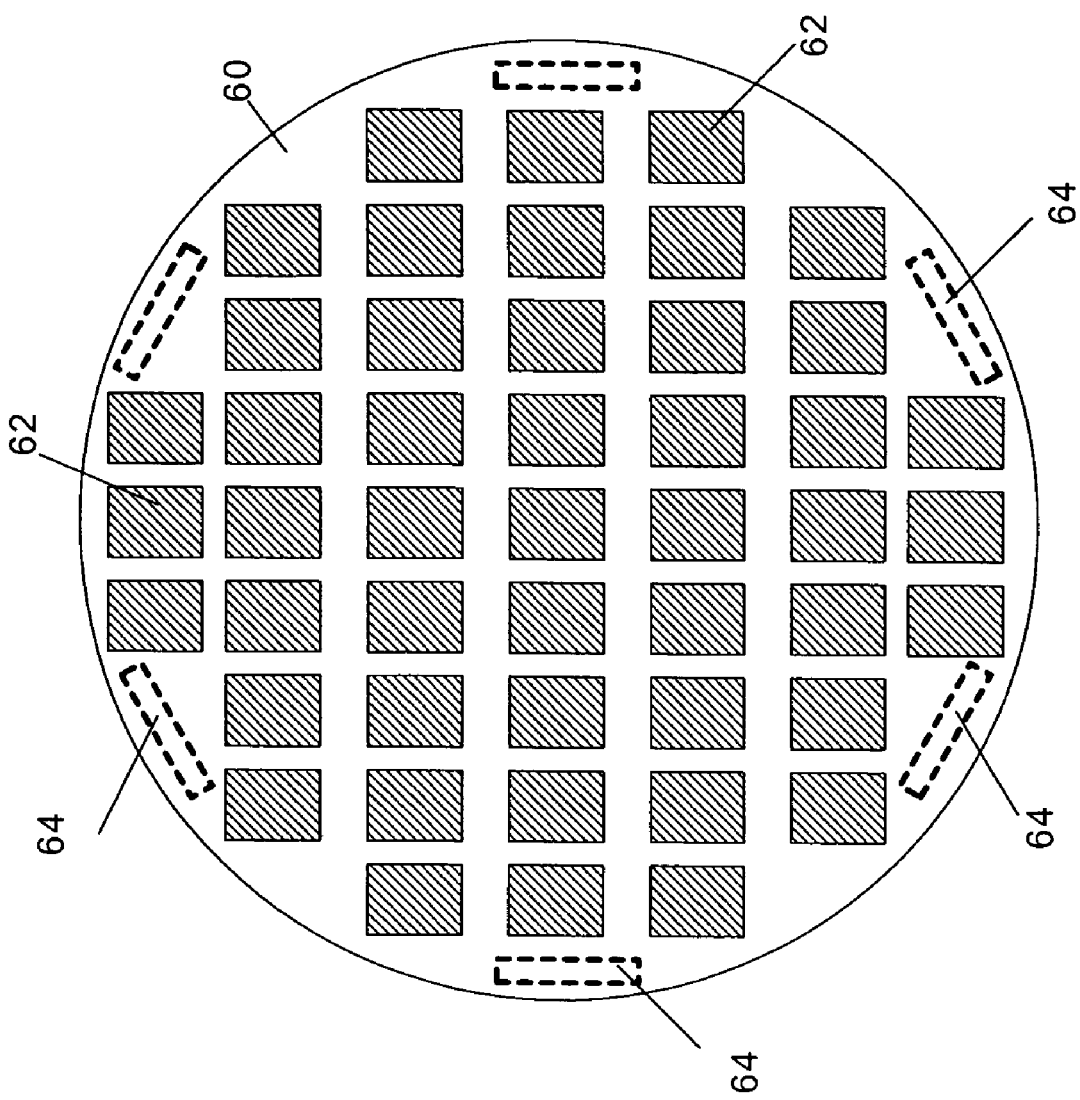
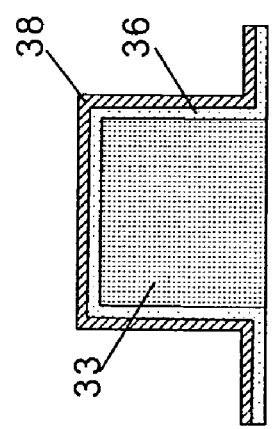
Figure 2F
Figure 2C

SYSTEM FOR CONTROLLING METAL FORMATION PROCESSES USING ION IMPLANTATION

CROSS-REFERENCE TO RELATED APPLICATION

This is a divisional of application Ser. No. 10/210,932 filed Aug. 2, 2002, now U.S. Pat. No. 6,727,175.

BACKGROUND OF THE INVENTION

1. Field of the Invention

This present invention is generally directed to the field of semiconductor processing, and, more particularly, to a method of using ion implantation techniques to control copper plating processes.

2. Description of the Related Art

There is a constant drive within the semiconductor industry to increase the operating speed of integrated circuit devices, e.g., microprocessors, memory devices, and the like. This drive is fueled by consumer demands for computers and electronic devices that operate at increasingly greater speeds. This demand for increased speed has resulted in a continual reduction in the size of semiconductor devices, e.g., memory cells, transistors, etc. That is, many components of a typical field effect transistor (FET), e.g., channel length, junction depths, gate insulation thickness, and the like, are reduced. For example, all other things being equal, the smaller the channel length of the transistor, the faster the transistor will operate. Thus, there is a constant drive to reduce the size, or scale, of the components of a typical semiconductor device to increase the overall speed of the device, as well as that of integrated circuit devices incorporating such semiconductor devices.

In modern integrated circuits, millions of very small semiconductor devices, e.g., transistors, memory cells, resistors, capacitors, etc., are formed above a semiconducting substrate, such as silicon. To produce a working integrated circuit, all of these various semi-conductor devices must be electrically coupled together. This is typically accomplished by a complex arrangement of conductive wiring, e.g., conductive lines and conductive plugs, that are formed in multiple layers of insulating material formed above the substrate. Historically, such conductive wiring patterns have been made from a variety of materials, such as aluminum.

However, as device dimensions continue to shrink, and as the desire for greater performance, e.g., faster operating speeds, has increased, copper has become more popular as the material for the conductive interconnections, i.e., conductive lines and vias, in modern integrated circuit devices. This is due primarily to the higher electrical conductivity of copper as compared to the electrical conductivity of other materials used for such wiring patterns, e.g., aluminum.

Typically, the copper wiring patterns may be formed by known techniques that involve single damascene or dual damascene processing techniques. FIGS. 1A–1C depict one illustrative process flow for forming conductive interconnections comprised of copper. As shown in FIG. 1A, a patterned layer of insulating material 12 is formed above a structure layer 10. The structure layer 10 is intended to be representative in nature in that it may be representative of a semiconducting substrate or a given level of a multiple level integrated circuit device. For example, the structure layer 10 may be a layer of insulating material, e.g., silicon dioxide, formed at some level above the substrate. Moreover, the structure layer 10 may, in some cases, have a plurality of conductive lines or vias (not shown in FIG. 1A) formed therein.

The patterned insulating layer 12 may be comprised of a variety of materials, e.g., silicon dioxide, BPSG, or a so-called "low-k" dielectric material, etc. The patterned insulating layer 12 may be formed by depositing the layer 12 and, thereafter, patterning the layer 12 using known photolithography and etching techniques. A plurality of trench features 14, 18 are thus defined in the patterned insulating layer 12. Ultimately, conductive interconnections comprised of copper will be formed in these trench features 14, 18. The features 14, 18 have a depth 19 of, for example, approximately 500 nm (5000 Å). Note that the width of the features 14, 18 may vary. For example, in the structure depicted in FIG. 1A, the features 14 have a width 16 of approximately 15 μm, whereas the feature 18 has a width 20 that is approximately 100 μm. That is, the physical dimensions of the features 14, 18 formed in the patterned layer of insulating material 12 may vary by a relatively large amount. For example, the features 14 may be used in forming conductive lines therein, and a large bond pad, e.g., approximately 100 μm×100 nm, may be formed in the feature 18. Ultimately, these various features 14, 18 will be filled with copper.

The process of forming the conductive interconnections comprised of copper typically begins with the conformal deposition of a barrier metal layer 22 above the patterned insulating layer 12, as depicted in FIG. 1B, which is an enlarged view of a portion of the patterned insulating layer 12. The various layers depicted in FIG. 1B are not shown in FIGS. 1A or 1C for purposes of clarity. After the barrier metal layer 22 is formed, a copper seed layer 24 is conformally deposited on the barrier metal layer 22. Next, known electroplating techniques are employed to form a bulk copper layer 26 (see FIG. 1A) above the patterned insulating layer 12 and in the features 14, 18. Thereafter, a chemical mechanical polishing process is performed to remove the excess copper material 26 positioned above the upper surface 13 of the patterned insulating layer 12. That is, the CMP process is performed until such time as the upper surface 27 of the copper conductive interconnections 26A is approximately planar with the upper surface 13 of the patterned layer of insulating material 12.

Due to the difference in sizes of the features 14, 18 in the patterned layer of insulating material 12, the features do not get completely filled at the same time. In the electroplating process, copper begins to uniformly form on the copper seed layer 24 across the wafer. Due to the large volume of the larger feature 18 as compared to the smaller volume of the smaller feature 14, it takes longer to fill the larger feature 18. Unfortunately, in existing processing methods, the electroplating process is performed for a sufficient duration to insure that the larger feature 18 is completely filled. A margin of error is also provided. For example, if the feature 18 has a depth of, for example, 500 nm, the electroplating process may be performed until such time as approximately 600 nm of copper has been formed in the feature 18. During this time, copper also continues to form in areas outside of the feature 18. This leads to an excessive accumulation of copper above portions of the patterned insulating layer 12 which must later be removed by expensive and time-consuming CMP processes. For example, in the process of filling the 500 nm deep feature 18, the copper above a portion of the patterned insulating layer 12 may be approximately 600 nm thick, as indicated by the arrow 17. This excess copper material tends to increase the time required for CMP operations, increase the cost of consumables used in CMP processes and otherwise reduce the efficiency of manufacturing operations.

The present invention is directed to a method that may solve, or at least reduce, some or all of the aforementioned problems.

SUMMARY OF THE INVENTION

The present invention is generally directed to various methods of using ion implantation techniques to control various metal formation processes. In one illustrative embodiment, the method comprises forming a metal seed layer above a patterned layer of insulating material, the patterned layer of insulating material defining a plurality of field areas, deactivating at least a portion of the metal seed layer in areas where the metal seed layer is positioned above at least some of the field areas, and performing a deposition process to deposit a metal layer above the metal seed layer. In some embodiments, the metal seed layer may be comprised of copper, platinum, nickel, tantalum, tungsten, cobalt, silver or gold. In further embodiments, an ion implant process may be performed to deactivate portions of the metal seed layer. The implanted ions may be comprised of nitrogen, carbon, silicon or hydrogen.

In another illustrative embodiment, the method comprises forming a copper seed layer above a patterned layer of insulating material, the patterned layer of insulating material defining a plurality of field areas, implanting ions into areas of the copper seed layer positioned above at least some of the field areas, and performing an electroplating process to deposit copper above the copper seed layer. In other embodiments, an electroless process is performed to deposit copper above the copper seed layer.

In yet another illustrative embodiment, the system comprises a stencil mask implant tool for implanting ions into selected areas of a metal seed layer formed above a patterned layer of insulating material that defines a plurality of field areas, the ions being implanted into areas of the metal seed layer positioned above at least some of the field areas. In some embodiments, the metal seed layer may be comprised of copper, platinum, nickel, tantalum, tungsten, cobalt, silver, gold, etc.

BRIEF DESCRIPTION OF THE DRAWINGS

The invention may be understood by reference to the following description taken in conjunction with the accompanying drawings, in which like reference numerals identify like elements, and in which:

FIGS. 1A–1C depict an illustrative prior art process flow for forming conductive interconnections comprised of copper; and FIGS. 2A–2H depict various aspects of one illustrative process flow in accordance with one embodiment of the present invention.

Figure 2G:
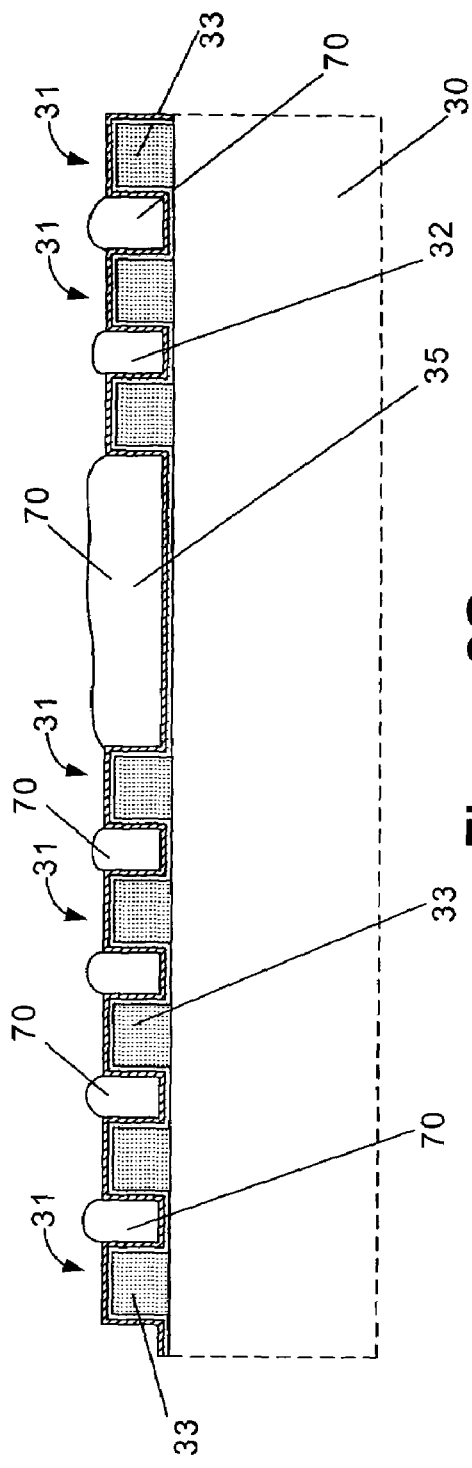

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Although various regions and structures shown in the drawings are depicted as having very precise, sharp configurations and profiles, those skilled in the art recognize that, in reality, these regions and structures are not as precise as indicated in the drawings. Additionally, the relative sizes of the various features and doped regions depicted in the drawings may be exaggerated or reduced as compared to the size of those features or regions on fabricated devices. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

FIG. 2A is a cross-sectional view of a patterned layer of insulating material 33 formed above a structure layer 30. As with the structure layer 10 described in the background section of the application, the structure layer 30 is intended to be representative in nature. The patterned layer of insulating material 33 may be comprised of any of a variety of materials, e.g., an oxide, an oxynitride, BPSG, a so-called "low-k" dielectric material., etc., and it may be formed by traditional techniques, e.g., chemical vapor deposition ("CVD"), low pressure chemical vapor deposition ("LPCVD"), etc. The patterned layer of insulating material 33 defines a plurality of trench-type features 32, 35 where copper material will ultimately be positioned and serve as part of the conductive wiring for the completed integrated circuit, i.e., the copper formed in the features 32, 35 will serve as, for example, a conductive line or via. The patterned insulating layer 33 also defines a plurality of field areas 31 where the conductive interconnections will not be formed.

In the depicted embodiment, the features 32, 35 have differing widths or critical dimensions. However, as will be understood by those skilled in the art after a complete reading of the present application, the present invention may be employed in situations where there is no or little difference in the critical dimensions of the features 32, 35 formed in the patterned insulating layer 33. The patterns in the insulating layer 33 may be formed by performing traditional photolithography and etching processes. Moreover, as will be understood by those skilled in the art after a complete reading of the present application, the current invention may be employed in the context of forming structures comprised of any of a variety of metals, e.g., copper, platinum, nickel, tungsten, tantalum, cobalt, etc. For convenience, the present invention will be disclosed in the context of the formation of a copper interconnect structure. However, the present invention should not be considered to be so limited unless such limitations are clearly set forth in the appended claims.

As shown in FIG. 2B, in one embodiment of the present invention, after the patterned insulating layer 33 is formed, a barrier metal layer 36 is conformally deposited above the patterned layer of insulating material 33 and in the trench-type features 32, 35. FIG. 2C is an enlarged view of a portion of the patterned layer 33. The barrier metal layer 36 may be comprised of a variety of different materials, e.g., tantalum, tantalum nitride, tungsten, tungsten nitride, and it may be formed by a variety of different techniques, e.g., physical vapor deposition ("PVD"), chemical vapor deposition ("CVD"), etc. The thickness of the barrier metal layer 36 may also vary. In one illustrative embodiment where copper will be formed in the features 32, 35, the barrier metal layer 36 may be comprised of tantalum and it may have a thickness that ranges from approximately 2–50 nm.

Next, a metal seed layer 38, e.g., a copper seed layer, is conformally deposited above the barrier metal layer 36. The metal seed layer 38 may be formed by a variety of processes, e.g., PVD. The thickness of the metal seed layer 38 may also vary. In one illustrative embodiment, the metal seed layer 38 is comprised of copper and it has a thickness that may range from approximately 50–250 nm. In other embodiments, the metal seed layer 38 may be comprised of platinum, nickel, tantalum, tungsten, cobalt, silver or gold.

In general, the present invention involves introducing a dopant material into at least some portions of the metal seed layer 38 positioned above at least some of the field regions 31 of the device. This doping will serve to deactivate at least the top surface 39 of the metal seed layer 38 such that, during the electroplating process performed to deposit a bulk metal layer, e.g., copper, in the features 32, 35, little or no deposition occurs on the top surface 39 of the metal seed layer 38 positioned in the field areas 31 of the device. Accordingly, little or no copper will be positioned above the field areas 31. This implantation process raises the potential at which the deposition of metal can occur. That is, the potential applied during subsequent processes used to deposit a metal layer above the metal seed layer 38 is less than the potential required to cause deposition to occur above the deactivated portions of the metal seed layer 38. Moreover, although the top surface 39 of the metal seed layer 38 is deactivated by the ion implant process, the remaining portions of the metal seed layer 38 can still carry the current needed during the electroplating process.

The present invention may also be employed in the context where an electroless process is used to deposit the bulk metal layer, e g., copper, in the features 32, 35. During the electroless deposition process, little or no copper will be formed above the implanted field areas of the metal seed layer 38. In general, an electroless plating process involves the formation of a thin film from an electrolytic solution without an externally applied voltage. The deposition is due to an electrochemical reaction among the metal ions, reducing agent, complexing, and pH adjusters on catalytic surfaces. In the case where an electroless deposition process is used, the ion implantation process acts to deactivate the metal seed layer 38 above the field areas 31 by changing the nucleation behavior in the implanted areas of the metal seed layer 38. More specifically, the ion implant process will act to raise the activation barrier. As a result, the electroless deposition process will be retarded or it will not occur on the deactivated portions of the metal seed layer 38.

The selective doping of the metal seed layer 38 may be accomplished by using a stencil mask lithographic ion implant (SLIM) tool developed by ULVAC of Japan. Aspects of this tool are disclosed in papers entitled "Lithography-less Ion Implantation Technology for Agile Fab," Shibata et al., and "Stencil Mask Ion Implantation Technology for High Performance MOSFETs," Shibata et al. A schematic depiction of such a stencil mask implant tool 40 is shown in FIG. 2D. In general, the stencil mask implant tool 40 is comprised of an ion beam generator 42 (ion source) for implanting ions and a mask or reticle 44, having a plurality of openings 46 formed therein. In operation, ions will be generated by the ion beam generator 42, and the mask 44 will be used to insure that dopant atoms (as indicated by the arrows 50) are only implanted at the desired locations. The stencil mask implant tool 40 may be stepped across the wafer in a step and expose technique similar to that employed in traditional stepper equipment used in photolithography processing. The implant process is continued until all desired areas of the copper seed layer 38 are implanted with the desired dopant material.

In one embodiment, the dopant atoms 50 implanted into the metal seed layer 38 may vary. For example, the dopant atoms 50 may be comprised of nitrogen, silicon, carbon, hydrogen, etc. The ions may be implanted at a dopant dosage of approximately $1e^{13}–1e^{21}$ ions/cm$^2$ and at an energy level of approximately 1–200 keV. In one illustrative embodiment, the dopant material and energy level of the implant process are selected such that the dopant materials are implanted for a depth of approximately 5–50 nm into the original thickness of the metal seed layer 38. This results in the implant regions 52 (see FIG. 2E) being formed in the metal seed layer 38 above the field areas 31 of the device. The implant regions 52 may have a thickness 54 that ranges from approximately 5–50 nm. The implant regions 52 are not shown in FIG. 2D for purposes of clarity.

The implant process described above may be performed in all desired areas of a wafer, e.g., in essentially all of the field areas 31. FIG. 2F is a plan view of an illustrative wafer 60 comprised of a plurality of production die 62. The metal seed layer 38, e.g., the copper seed layer, is typically deposited across the entire surface of the wafer 60, although the copper seed layer 38 is not depicted in FIG. 2F. Using traditional electroplating techniques, a plurality of conductive clamps (not shown) are positioned in contact with the copper seed layer 38 such that a current may be passed through the copper seed layer 38 during the electroplating process. In FIG. 2F, a plurality of illustrative contact areas 64 for such conductive clamps are schematically depicted. During the implant process described above, the copper seed layer 38 within such contact areas 64 would not be implanted with the dopant material. Of course, as will be recognized by those skilled in the art, the illustrative contact areas 64 are only representative in nature. That is, the size, shape, number and location of such contact areas 64 may vary depending upon the particular type of electroplating equipment employed.

Figure 2H:
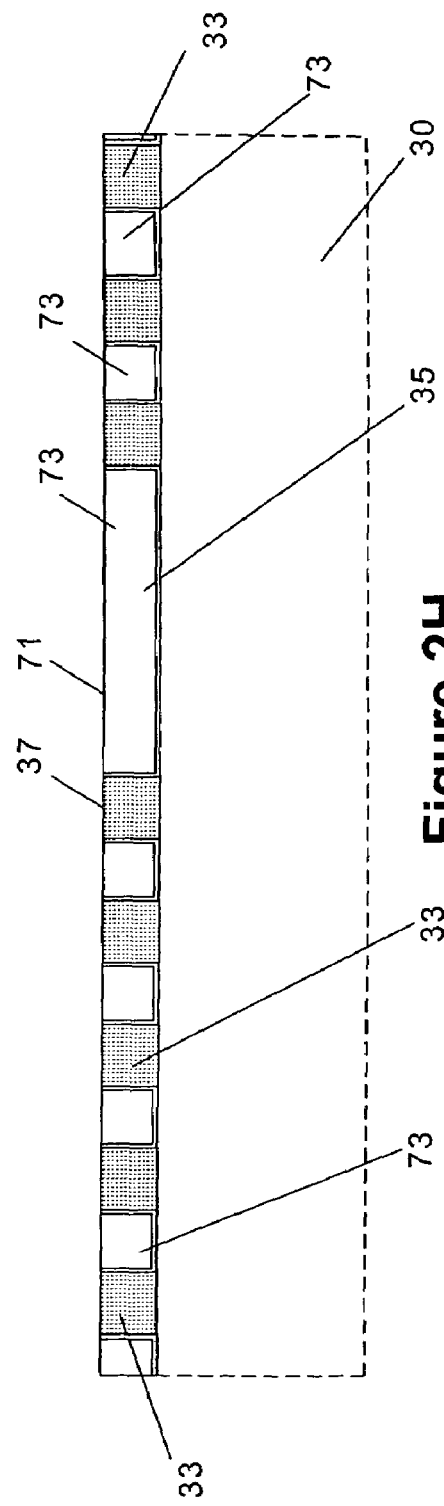

After the ion implant process is completed, a bulk metal layer 70, e.g., a bulk copper layer 70, may be formed in the features 32, 35 in the patterned layer of insulating material 33 by performing known electroplating or electroless processes. The bulk metal may also be comprised of copper, platinum, nickel, tantalum, tungsten, cobalt, silver or gold. Note that, due to the ion implant regions 52 in the metal seed layer 38, little or no metal is formed above the field regions 31 of the device. Although the wider feature 35 will still take longer to fill than the smaller feature 32, less excess metal will be generated above the features 32 and the field areas 31. As a result, subsequent chemical mechanical polishing processes may be performed in a more efficient manner. FIG. 2H is a depiction of the device after a CMP process has been performed to remove the excess metal and the barrier metal layer 36 from above the surface of the patterned insulating layer 33. That is, CMP operations are performed until such time as the upper surface 71 of the conductive copper structures 73 is approximately planar with the upper surface 37 of the patterned layer of insulating material 33. This process may be repeated layer after layer as the wiring pattern for the device is formed in multiple levels of insulating material. Moreover, the present invention may be employed with a variety of different techniques for forming such conductive interconnections, e.g., single damascene, dual damascene, etc.

The present invention is generally directed to various methods of using ion implantation techniques to control various metal formation processes. In one illustrative embodiment, the method comprises forming a metal seed layer above a patterned layer of insulating material, the patterned layer of insulating material defining a plurality of field areas, deactivating at least a portion of the metal seed layer in areas where the metal seed layer is positioned above at least some of the field areas, and performing a deposition process to deposit a meal layer above the metal seed layer. In some embodiments, the metal seed layer may be comprised of copper, platinum, nickel, tantalum, tungsten, cobalt, silver or gold. In further embodiments, an ion implant process may be performed to deactivate portions of the metal seed layer. The implanted ions may be comprised of nitrogen, carbon, silicon or hydrogen.

In another illustrative embodiment, the method comprises forming a copper seed layer above a patterned layer of insulating material, the patterned layer of insulating material defining a plurality of field areas, implanting ions into areas of the copper seed layer positioned above at least some of the field areas, and performing an electroplating process to deposit copper above the copper seed layer. In other embodiments, an electroless plating process may be performed to deposit copper above the copper seed layer.

In yet another illustrative embodiment, the system comprises a stencil mask implant tool for implanting ions into selected areas of a metal seed layer formed above a patterned layer of insulating material that defines a plurality of field areas, the ions being implanted into areas of the metal seed layer positioned above at least some of the field areas. In some embodiments, the metal seed layer may be comprised of copper, platinum, nickel, tantalum, tungsten, cobalt, etc.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A system, comprising:
   a stencil mask implant tool for implanting ions into selected areas of a metal seed layer formed above a patterned layer of insulating material that defines a plurality of field areas, said metal seed layer comprising a plurality of horizontal surfaces, said ions being implanted through a reticle that is not in contact with said metal seed layer and into areas of said metal seed layer positioned above at least some of said field areas but not into all of said horizontal surfaces of said metal seed layer.

2. The system of claim 1, further comprising a chemical mechanical polishing tool for performing a chemical mechanical polishing process to remove at least portions of said metal seed layer.

3. The system of claim 1, further comprising an electroplating bath for depositing a layer of metal above said metal seed layer.

4. The system of claim 3, wherein said electroplating bath is adapted to deposit a layer of metal comprised of copper.

5. The system of claim 1, wherein said stencil mask tool is adapted to implant ions comprised of at least one of nitrogen, carbon, silicon and hydrogen into said metal seed layer.

6. The system of claim 1 wherein said stencil mask tool is adapted to implant ions into selected portions of said metal seed layer, said metal seed layer being comprised of at least one of copper, platinum, nickel, tungsten, tantalum, cobalt, silver and gold.

7. The system of claim 1, further comprising a deposition tool to deposit a metal layer above said metal seed layer.

8. The system of claim 7, wherein said deposition tool is adapted to deposit a metal layer comprised of at least one of copper, platinum, nickel, tungsten, tantalum, cobalt, silver and gold.

9. The system of claim 1, further comprising an electroless bath for depositing a layer of metal above said metal seed layer by an electroless process.

10. A system, comprising:
    a stencil mask implant tool for implanting ions into selected areas of a copper seed layer formed above a patterned layer of insulating material that defines a plurality of field areas, said copper seed layer comprising a plurality of horizontal surfaces, said ions being implanted through a reticle that is not in contact with said copper seed layer and into areas of said copper seed layer positioned above at least some of said field areas but not into all of said horizontal surfaces of said copper seed layer.

11. The system of claim 10, further comprising a chemical mechanical polishing tool for performing a chemical mechanical polishing process to remove at least portions of said copper seed layer.

12. The system of claim 10, further comprising an electroplating bath for depositing a layer of copper above said copper seed layer.

13. The system of claim 10, wherein said stencil mask tool is adapted to implant ions comprised of at least one of nitrogen, carbon, silicon and hydrogen into said copper seed layer.

14. The system of claim 10, further comprising an electroless bath for depositing a layer of metal above said metal seed layer by an electroless process.

* * * * *